(12) United States Patent
Murthy et al.

(10) Patent No.: US 6,235,568 B1
(45) Date of Patent: May 22, 2001

(54) SEMICONDUCTOR DEVICE HAVING DEPOSITED SILICON REGIONS AND A METHOD OF FABRICATION

(75) Inventors: Anand Murthy, Beaverton; Chia-Hong Jan, Portland; Ebrahim Andideh, Portland; Kevin Weldon, Portland, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/235,782

(22) Filed: Jan. 22, 1999

(51) Int. Cl.$^7$ .................. H01L 21/8238; H01L 21/336
(52) U.S. Cl. ................ 438/231; 438/300; 438/527; 438/607
(58) Field of Search .................... 438/527, 597, 438/607, 231, 300

(56) References Cited

U.S. PATENT DOCUMENTS

| | | |
|---|---|---|
| 5,089,441 * | 2/1992 | Moslehi . |
| 5,168,072 * | 12/1992 | Moslehi . |
| 5,252,501 * | 10/1993 | Moslehi . |
| 5,397,909 * | 3/1995 | Moslehi . |
| 5,403,434 * | 4/1995 | Moslehi . |
| 5,716,861 * | 2/1998 | Moslehi . |
| 5,801,078 * | 9/1998 | Jimenez . |
| 5,908,309 * | 6/1999 | Andoh . |
| 6,066,523 * | 6/1998 | Shim et al. . |

OTHER PUBLICATIONS

Suzuki et al., "Effects of Si–Ge buffer layer for low–temperature Si epitaxial growth on Si substrate by rf plasma chemical vapor deposition," J. App. Phys. 54(3) pp. 1466–1470, Mar. 1983.*

Single–Wafer Integrated Semiconductor Device Processing, Mehrdad M. Moslehi, Member, IEEE, Richars A. Chapman, Member, IEEE, Man Wong, Member, IEEE, Ajit Pranjpe, Habib N. Najm, John Kuehne, Richard L. Yeakley, and Cecil J. Davis. IEEE Transactions on Electron Devices. vol. 39. No. 1. Jan. 1992.

The Viability of GeH4–Based In–situ Clean for Low Temperature Growth Silicon Epitaxial Growth, C.–L. Wang, S. Unnikrishnan, B.–Y. Kim, D.L. Kwong, and A.F. Tasch Microeletronics Research Center, University of Texas at Austin, Autin, TX 78712.

* cited by examiner

Primary Examiner—Richard Booth
(74) Attorney, Agent, or Firm—Blakely, Sokoloff, Taylor & Zafman LLP

(57) ABSTRACT

The present invention describes an MOS device having deposited silicon regions and its a method of fabrication. In one embodiment of the present invention a substrate having a thin oxide layer formed on a silicon surface is heated and exposed to an ambient comprising germane (GeH$_4$) to remove the thin oxide from the silicon surface. A silicon or silicon alloy film can then be deposited onto the silicon surface of the substrate.

30 Claims, 10 Drawing Sheets

SEMICONDUCTOR DEVICE HAVING DEPOSITED SILICON REGIONS AND A METHOD OF FABRICATION

BACKGROUND OF THE INVENTION

1. Field of the Invention

The present invention relates to the field of semiconductor manufacturing and more specifically to a method of forming a novel MOS transistor with deposited silicon regions.

2. Discussion of Related Art

Today literally millions of individual transistors are coupled together to form very large-scale integrated (VSLI) circuits, such as microprocessors, memories, and application specific integrated circuits (IC's). Presently, the most advanced IC's are made up of approximately three million transistors, such as metal oxide semiconductor (MOS) field effect transistors having gate lengths on the order of 0.25 μm. In order to continue to increase the complexity and computational power of future integrated circuits, more transistors must be packed into a single IC (i.e., transistor density must increase). Thus, future ultra large-scale integrated (ULSI) circuits will require very short channel transistors with effective gate lengths less than 0.1 μm. Unfortunately, the structure and method of fabrication of conventional MOS transistors cannot be simply "scaled down" to produce smaller transistors for higher density integration.

The structure of a conventional MOS transistor 100 is shown in FIG. 1. Transistor 100 comprises a gate electrode 102, typically polysilicon, formed on a gate dielectric layer 104 which in turn is formed on a silicon substrate 106. A pair of source/drain extensions or tip regions 110 are formed in the top surface of substrate 106 in alignment with outside edges of gate electrode 102. Tip regions 110 are typically formed by well-known ion implantation techniques and extend beneath gate electrode 102. Formed adjacent to opposite sides of gate electrode 102 and over tip regions 110 are a pair of sidewall spacers 108. A pair of source/drain contact regions 120 are then formed, by ion implantation, in substrate 106 substantially in alignment with the outside edges of sidewall spacers 108.

As device features are continually scaled down, the source/drain contact resistance negatively impacts device performance. In order to help reduce the contact resistance, deposited silicon can be formed on the source/drain contact regions 120 to generate raised source/drain regions and/or to form a sacrificial silicon film for a silicide process. Unfortunately, present techniques for selectively depositing silicon generally require high temperature hydrogen predeposition bakes at 900° C. or higher for a period of a minute or longer. Such high temperature predeposition bakes increase the thermal energy seen by the devices which can cause an undesired redistribution of dopants. Additionally, present selective silicon deposition techniques are highly dependent upon the conductivity type of the silicon surface on which they are formed. As such, one is presently unable to selectively deposit a silicon film onto p-type and n-type silicon surfaces at the same time. Still further, present processing techniques are unable to uniformly deposit highly (>5×10$^{21}$ atoms/cm$^3$) insitu doped silicon films at a low temperatures and with a low thermal budget without discontinuities or faceting, making present deposition techniques incompatible with the formation of raised source/drain regions.

Thus, what is desired is a method of forming a selectively deposited, highly conductive insitu doped silicon or silicon alloy film at low temperatures and simultaneously onto both conductivity types of silicon surfaces.

SUMMARY OF THE INVENTION

The present invention describes an MOS device having deposited silicon regions and its method of fabrication. In one embodiment of the present invention a substrate having a thin oxide layer formed on a doped silicon surface is heated and exposed to an ambient comprising germane (GeH$_4$) to remove the thin oxide from the silicon surface. A silicon or silicon alloy film can then be deposited onto the silicon surface of the substrate.

BRIEF DESCRIPTION OF THE DRAWINGS

FIG. 2b is an illustration of a cross-sectional view showing the formation of n-type tip regions in the substrate of FIG. 2a.

FIG. 3b is an illustration of a cross-sectional view showing the formation of n-type insitu doped silicon germanium on the substrate of FIG. 3a.

DETAILED DESCRIPTION OF THE PRESENT INVENTION

Figure 1:
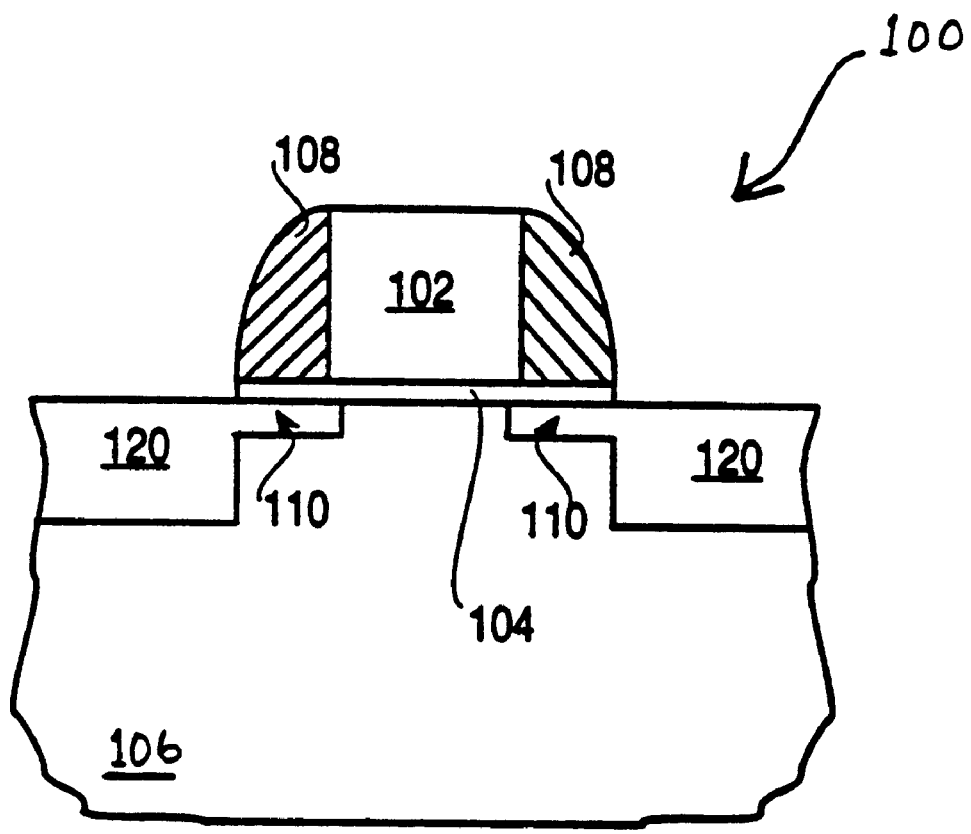
FIG. 1 is an illustration of a cross-sectional view of a conventional transistor.

The present invention describes a novel semiconductor device having deposited silicon regions and methods of fabrication. In the following description numerous specific details are set forth, such as specific materials, dimensions, and processes etc., in order to provide a thorough understanding of the present invention. It will be obvious, however, to one skilled in the art that the invention may be practiced without the specific details. In other instances, well known semiconductor equipment and processes have not been described in particular detail in order to avoid unnecessarily obscuring the present invention.

The present invention is ideally suited for forming a pair of complementary metal oxide semiconductor (CMOS) devices. Standard processing techniques are used to form a pMOS device and nMOS device on a semiconductor substrate. A very low energy implant is then used to deposit n-type dopants into the surface of the p-type source/drain regions of the pMOS device or alternatively a low energy implant is used to deposit p-type dopants into the surface of the n-type source/drain regions of the nMOS device. In this way the surface of the source/drain regions of the pMOS and nMOS device have the same dopant conductivity type which enables a subsequent deposition of a silicon or silicon alloy film to be formed uniformly on both device types.

The substrate is then heated and exposed to an ambient comprising germane ($GeH_4$) and preferably comprising germane ($GeH_4$) hydrogen ($H_2$) and hydrochloric acid (HCl) to remove native oxides formed on the source/drain regions of the pMOS and nMOS devices. Next, a silicon film and preferably a silicon germanium alloy film is selectively deposited onto the source/drain regions. Because both source/drain regions of the pMOS and nMOS device have the same dopant type on the surface, the silicon deposition is uniform across the surface of the wafer or substrate.

In a embodiment of the present invention a relatively high deposition pressure ($\geq 10$ torr and >atmospheric) is used to selectively deposit a silicon or silicon alloy film. The use of a relatively high deposition pressure enables a uniform silicon or silicon alloy film to be selectively deposited onto silicon surfaces with reduced faceting. Additionally, the relatively high deposition pressure enables a silicon or silicon alloy film to be insitu doped with boron or phosphorous at high dopant concentrations ($>5\times10^{20}/cm^3$) and at relatively low temperatures of less than or equal to 750° C.

Various aspects of the present invention will now be described with respect to the formation of a pair of complementary metal oxide semiconductor (CMOS) devices as illustrated in FIGS. 2a–2l and FIGS. 3a–3e. It is to be appreciated that the described processes are only illustrative of how each of the individual aspects of the present invention can be utilized to form semiconductors with deposited silicon. It is to be understood that the individual aspects of the present invention, such as the predeposition blanket implant, the insitu flash bake, and the high pressure selective deposition process can be used individually or in combination with one another in order to form high quality high reliability semiconductor devices with deposited silicon regions. Additionally, although the present invention is described with respect to formation of a pair of CMOS devices one skilled in the art will appreciate the ability to use aspects of the present invention to form just nMOS devices or pMOS devices or to form other semiconductor devices such as bipolar devices.

Figure 2A:
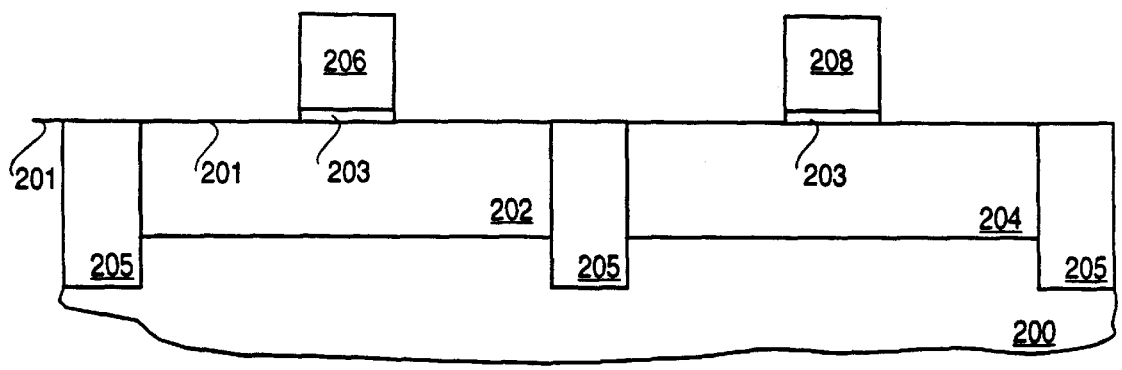
FIG. 2a is an illustration of a cross-sectional view of the formation of a first gate electrode on a p-well and the formation of second gate electrode on an n-well.

According to an embodiment of the present invention, a silicon substrate 200 is provided as shown in FIG. 2a. A plurality of field isolation regions 205 are formed in substrate 200 to isolate wells of different conductivity types and to isolate adjacent transistors. Field isolation regions 205 are preferably shallow trench isolation (STI) regions formed by etching a trench into substrate 200 and then filling the trench with a deposited oxide. Although STI isolation regions are preferred because of their ability to be formed to small dimensions with a high degree of planarity, other methods can be used such as, but not limited to, local oxidation of silicon (LOCOS), recessed LOCOS, or silicon on insulator (SOI), and suitable insulators, other than oxides, such as nitrides may be used if desired.

Silicon substrate 200 includes a first region 202 of p-type conductivity in the range of $1\times10^{17}/cm^3$–$1\times10^{19}/cm^3$ and a second region 204 of n-type conductivity in the range of $1\times10^{17}/cm^3$–$1\times10^{19}/cm^3$. According to the preferred embodiment, n-type conductivity region 204 is a n-well formed by a first implant of phosphorous atoms at a dose of $4\times10^{13}/cm^2$ and an energy of 475 keV, a second implant of phosphorous atoms at a dose of $2.5\times10^{12}/cm^2$ at an energy of 60 keV, and a final implant of arsenic atoms at a dose of $1\times10^{13}/cm^2$ at an energy of 180 keV into a silicon substrate 200 having a concentration of $1\times10^{16}/cm^3$ in order to produce an n-well 204 having a n-type concentration of approximately $7.0\times10^{17}/cm^3$. Additionally, according to the preferred embodiment of the present invention, p-type conductivity region 202 is a p-well formed by a first implant of boron atoms at a dose of $3.0\times10^{13}/cm^2$ at an energy of 230 keV followed by a second implant of boron ions at a dose of $4.2\times10^{13}/cm^3$ and an energy of 50 keV into substrate 200 in order to produce a p-well 202 having a p-concentration of $7.0\times10^{17}/cm^3$. It is to be appreciated that p-type conductivity region 202 and n-type conductivity 204 may be formed by other means including providing an initially doped substrate, or depositing an insitu doped semiconductor material with a desired conductivity. According to the present invention, a substrate is defined as the starting material on which the transistors of the present invention are fabricated and in one embodiment includes p-well 202 and n-well 204.

According to the present invention, a first gate dielectric layer 203 is formed on the top surface 201 of substrate 200 as shown in FIG. 2a. Gate dielectric layer 203 is preferably a nitrided oxide layer formed to a thickness of between 20–50 angstroms (Å). It is to be appreciated that other well known gate dielectric layers such as oxides, nitrides, and combinations thereof may be utilized if desired. Next, a gate electrode 206 is formed over gate dielectric layer 203 formed over p-well 202 and a gate electrode 208 is formed over gate dielectric layer 203 formed over n-well 204. Gate electrodes 206 and 208 are preferably formed from a 1000–3500 Å thick layer of blanket deposited polysilicon patterned into gate electrodes 206 and 208 with well known photolithographic techniques. If desired, the polysilicon layer can be ion implanted to the desired conductivity type and level prior to patterning.

It is to be appreciated that other well known patterning techniques may be utilized to pattern the polysilicon layer into gate electrodes 206 and 208 including submicron lithography techniques, such as e-beam and x-ray, and subphotolithographic patterning techniques such as described in U.S. Pat. No. 5,434,093 entitled "Inverted Spacer Transistor" and assigned to the present Assignee. According to the presently preferred method of the present invention, polysilicon gate electrodes 206 and 208 preferably have a drawn length of approximately 0.2 μm (i.e., 2000 Å). Additionally, although gate electrodes 206 and 208 are preferably polysilicon gate electrodes, gate electrodes 206 and 208 can be, but are not limited to, metal gates, a single crystalline silicon gate, or any combination thereof, if desired.

Figure 2B:
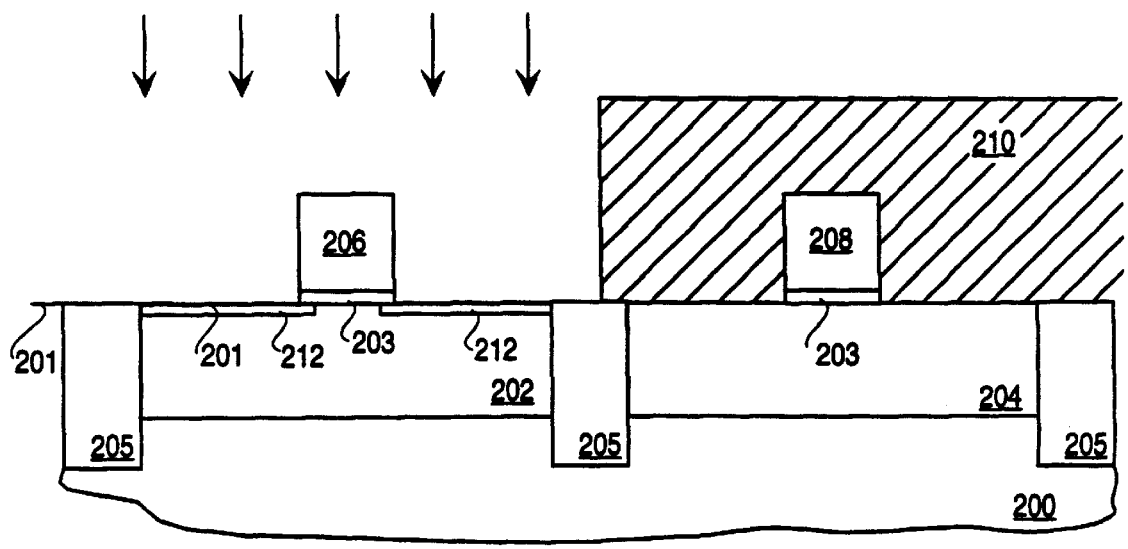

Next, as shown in FIG. 2b, substrate 200 is covered with a photoresist layer. The photoresist layer is then patterned with well known photolithography techniques to form a photoresist mask 210 which exposes p-well 202 and masks n-well 204. Next, n-type conductivity ions are implanted into substrate 200 to form conventional N-tip regions 212 in alignment with the outside edges of gate electrode 206. Gate electrode 206 prevents the region beneath gate electrode 206 from being im planted with ions. Additionally, photoresist mask 210 prevents n-well 204 from being doped by the N-tip implant. N-tip regions 212 preferably have a concentration in the range of approximately $1 \times 10^{20}$–$2.5 \times 10^{21}$/cm$^3$. N-tip regions 212 can be formed by ion implanting arsenic atoms (As$^{75}$) at a dose of $1.65 \times 10^{15}$/cm$^2$ and an energy of 4 keV. (It is to be appreciated that N-tip regions 212 will diffuse laterally beneath gate electrode 206 during a subsequent annealing process.) Such an implant will create a peak concentration of about $2 \times 10^2$ atoms/cm$^3$ at a depth of 6 nm. Next, photoresist mask 210 is removed by well known techniques.

Figure 2C:
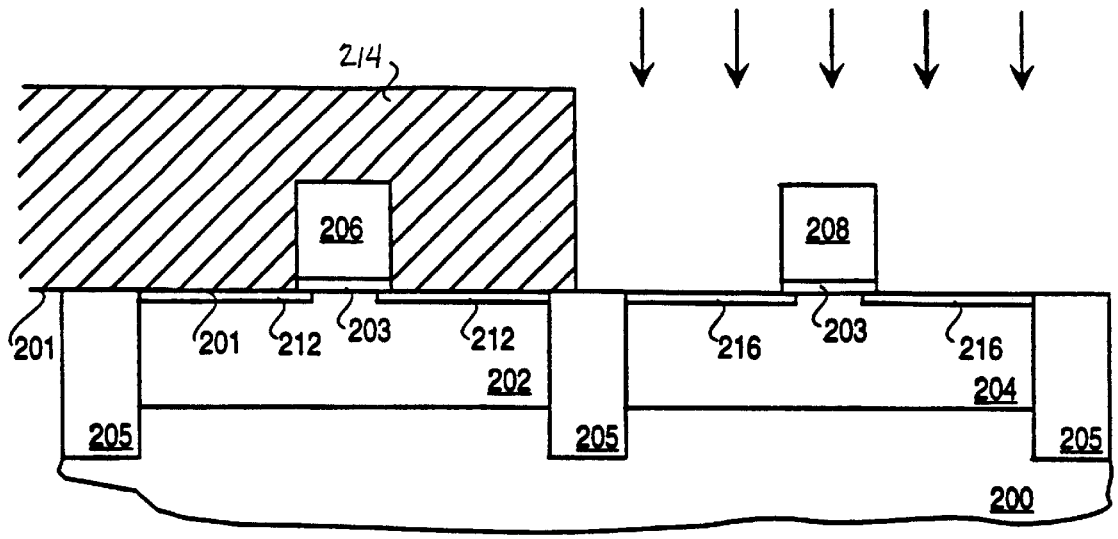
FIG. 2c is an illustration of a cross-sectional view showing the formation of p-type tip regions in the substrate of FIG. 2b.

Next, as shown in FIG. 2c, substrate 200 is covered with a photoresist layer. The photoresist layer is then patterned with well known photolithography techniques to form a photoresist mask 214 which exposes n-well 204 and masks p-well 202. Next, p-type conductivity ions are implanted into substrate 200 to form conventional p-tip regions 216 in alignment with the outside edges of gate electrode 208. Gate electrode 208 prevents the region beneath gate electrode 208 from being implanted with ions. Additionally, photoresist mask 214 prevents p-well 202 from being doped by the p-tip implant. P-tip regions 216 preferably have a peak concentration in the range of approximately $1 \times 10^{20}$ –$5 \times 10^{21}$/cm$^3$. P-tip regions 216 can be formed by ion implanting boron atoms (B$^{11}$) at a dose of $3.3 \times 10^{14}$/cm$^2$ at an energy of 500 eV. Such an implant will produce a peak concentration of about $7 \times 10^{20}$ atoms/cm$^3$ at a depth of <3 nm. (It is to be appreciated that p-tip regions 216 will diffuse laterally beneath gate electrode 208 during a subsequent annealing process. For clarity purposes the implanted regions are illustrated with respect to their final positioning after a suitable activation/drive anneal which may occur directly after each implantation or during an anneal which occurs after all implantation's have been made.) Next, photoresist mask 214 is removed by well known techniques.

Figure 2D:
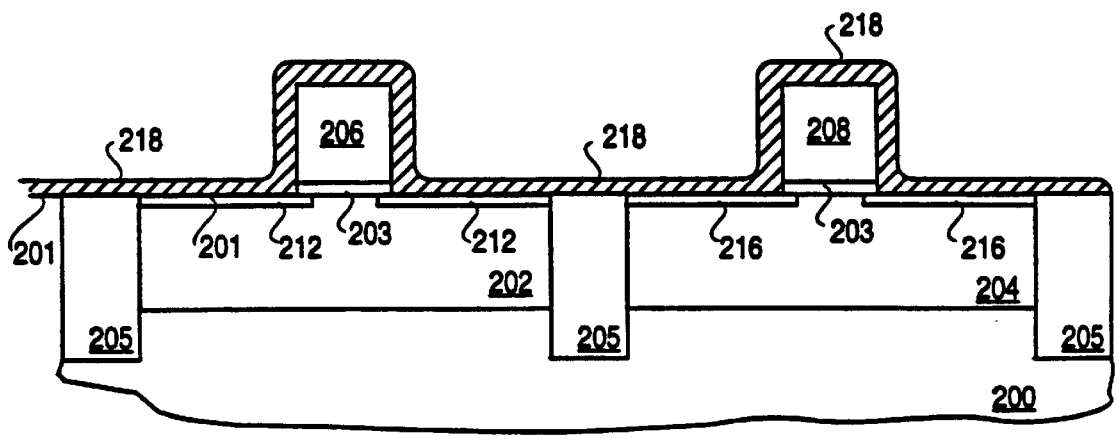
FIG. 2d is an illustration of a cross-sectional view showing the formation of a spacer layer on the substrate of FIG. 2c.

Next, as shown in FIG. 2d, a spacer layer 218 is formed over substrate 200 including p-well 202, the top and sides of gate electrode 206, n-well 204 and the top and sides of gate electrode 208. Spacer layer 218 will subsequently be used to form sidewall spacers for the nMOS and pMOS devices. Spacer layer 218 is formed to a thickness of between 50–2500 Å. It is to be appreciated that spacer layer 218 must be formed thick enough to electrically isolate a subsequently deposited semiconductor material from gate electrode 206. Additionally, the thickness of spacer layer 218 defines the resulting spacer thickness and therefore controls the resulting offset of subsequent source/drain contact regions from gate electrodes 206 and 208.

Spacer layer 218 is preferably silicon nitride film formed by a "hot-wall" process to provide a very hermetic seal of gate electrodes 206 and 208, and the edges of gate dielectric 203. By forming silicon nitride spacer layer 218 directly onto gate electrode 206 and 208, a hermetic seal is formed and the hot electron lifetime of the fabricated transistors dramatically improved. A silicon nitride layer 218 can be formed by a low pressure chemical vapor deposition (LPCVD) process by reacting ammonia (NH$_3$) and dichlorosilane (DCS) at a pressure of approximately 10 pascals and at a temperature of approximately 800° C. Although a hot wall silicon nitride layer is preferred in the present invention because of the hermetic seal it forms, any other suitable insulating layer, such as a deposited oxide or a composite oxide/silicon nitride film, can be used if desired.

Figure 2E:
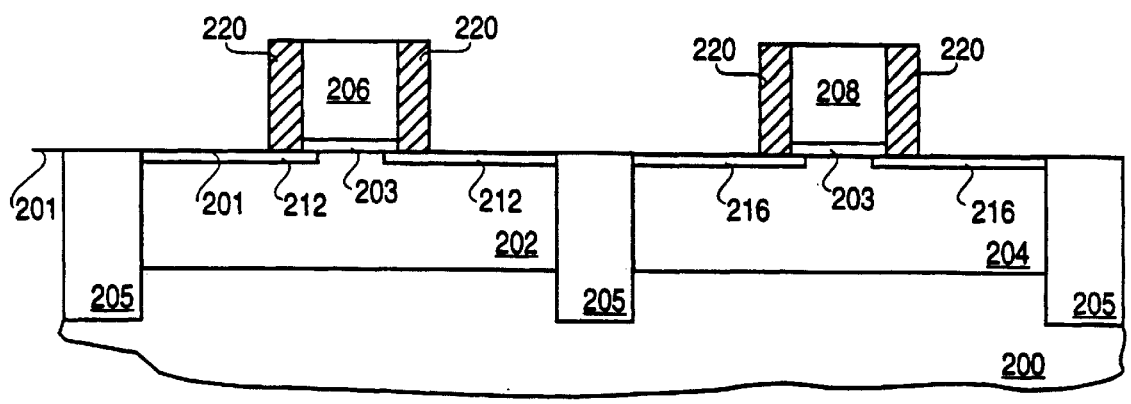
FIG. 2e is an illustration of a cross-sectional view showing the formation of sidewall spacers from the spacer layer on the substrate of FIG. 2d.

Next, as shown in FIG. 2e, spacer layer 218 is antisotropically dry etched to form a pair of sidewall spacers 220 which run along laterally opposite sidewalls of gate electrode 206 and 208. According to an embodiment of the present invention silicon nitride spacers 220 are formed by antisotropically plasma etching a silicon nitride spacer layer 218 using a chemistry comprising C$_2$F$_6$ and a power of approximately 200 watts.

Figure 2F:
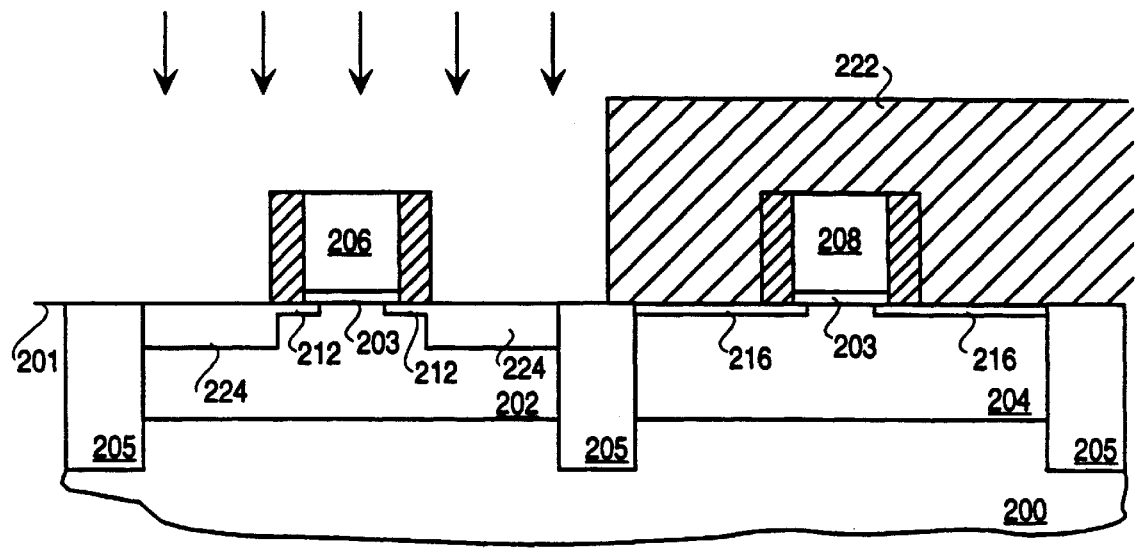
FIG. 2f is an illustration of a cross-sectional view showing the formation of heavily doped n-type source/drain contact regions on the substrate of FIG. 2e.

Next, as shown in FIG. 2f, a photoresist layer is formed over substrate 200 and patterned into a mask 222 which exposes p-well 202 and masks n-well 204. A pair of n+source/drain contact regions 224 are then formed in p-well 202 on opposite sides of gate electrode 206 and in alignment with the outside edges of sidewall spacers 220. N+source/drain regions 224 can be formed by ion implanting n-type dopants, such as arsenic (As$^{75}$) or phosphorous, at a dose of between $1 \times 10^{15}$–$1 \times 10^{16}$ atoms/cm$^2$ and a energy of between 30–80 Kev to form source/drain contact regions having a peak doping density of about $1.5 \times 10^{21}$ atoms/cm$^3$ at a depth of 40 nm. (It is to be appreciated that the n-type source/drain contact regions will diffuse latterly beneath spacers 220 during subsequent annealing process.) Next, the photoresist mask 222 is removed.

Figure 2G:
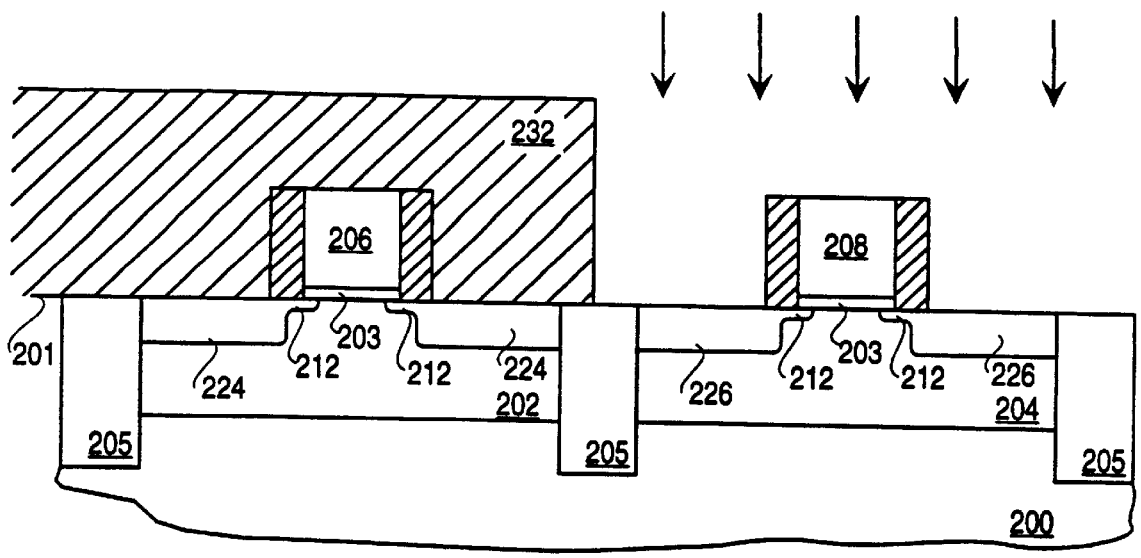
FIG. 2g is an illustration of a cross-sectional view showing the formation of heavily doped p-type source/drain contact regions in the substrate of FIG. 2f.

Next, as shown in FIG. 2g, a photoresist layer is formed over substrate 200 and patterned into a mask 232 which exposes n-well 204 and masks p-well 202. A pair of p+source/drain contact regions 226 are then formed in n-well 204 on opposite sides of gate electrode 208 and in alignment with the outside edges of sidewall spacers 220. P+source/drain contact regions can be formed by ion implanting p-type dopants such as boron (B$^{11}$) at a dose of $1 \times 10^{15}$–$6 \times 10^{15}$ atoms/cm$^2$ and an energy of 5–12 Kev to form source/drain contact regions 226 having a peak doping density of $7 \times 10^{20}$ atoms/cm$^3$ at a depth of approximately 35 nm. (It is to be appreciated that p-type source/drain contact regions will diffuse latterly beneath spacers 220 during subsequent annealing process.) Next the photoresist mask 232 is removed.

In an embodiment of the present invention the source/drain contract implants and the tip implants are activated with a single anneal step at this time. The implants can be activated with a rapid thermal anneal (RTA) at a temperature between 1000–1060° C., with 1030° C. being preferred, in a nitrogen ambient for between 2–20 seconds with 10 seconds being preferred.

Figure 2H:
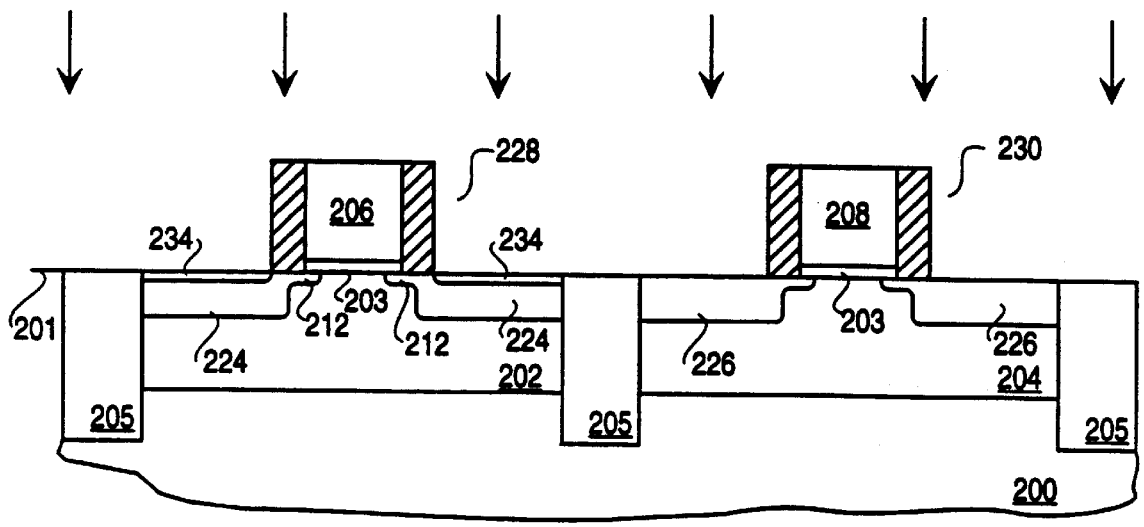
FIG. 2h is an illustration of a cross-sectional view showing a low energy predeposition blanket ion implantation of a substrate of FIG. 2g.

Next, as shown in FIG. 2h, substrate 200 is subjected to a predeposition low energy blanket ion implantation step. The function of the low energy predeposition blanket ion implantation step is to form shallow regions of one conductivity (e.g. p-type) in the source/drain regions of the opposite conductivity type (e.g. n-type source/drain regions 224) so that the surface characteristics of the source/drain regions of the pMOS device 230 and the source/drain regions of nMOS device 228 appear to be the same to a subsequent deposition process. In this way, subsequent prebake and silicon deposition conditions can be optimized for deposition onto either p-type or n-type silicon and thereby enable a smooth silicon film to be deposited without agglomeration or discontinuities on both the n-type and p-type source/drain regions of the pMOS and nMOS devices respectively. The predeposition implant occurs without the use of a mask so that both the p-well regions 302 and the n-well regions 304 of substrate 300 are implanted with dopants.

For example, in one embodiment of the present invention, as shown in FIG. 2h, p-type dopants are blanket implanted at a low energy into substrate 200. The blanket implantation step forms p-type regions 234 in the surface of the n-type source/drain regions 224 of nMOS device 228. The p-type blanket implant also places p-type dopants into p-type source/drain regions 226 of pMOS device 230. Shallow p-type surface regions 234 can be formed by blanket ion implanting boron ($B^{11}$) at a density of between $5 \times 10^{13} - 1 \times 10^{15}$ atoms/cm$^3$ with $2 \times 10^{14}$ atoms/cm$^2$ being preferred and an energy of between 1–5 Kev with 2 Kev being preferred into substrate 200. Such an implant will form p-type surface regions having a depth of 8 nm and a peak density of $9 \times 10^{19}$ atoms/cm$^3$.

In an alternative embodiment of the present invention, instead of blanket depositing p-type dopants, n-type dopants, such as arsenic or phosphorus, are blanket deposited into substrate 200 to form shallow n-type surface regions in the p-type source/drain regions 226 of nMOS device 230. The n-type blanket implant also places n-type dopants into the n-type source/drain regions of nMOS device 228. Shallow n-type surface regions can be formed by blanket depositing arsenic ($As^{75}$) at a density of between $5 \times 10^{13} - 1 \times 10^{15}$ atoms/cm$^2$ with $2 \times 10^{14}$ atoms/cm$^2$ being preferred and an energy of between 30–80 Kev with 50 keV being preferred into substrate 200. Such an implant will form n-type surface regions having a depth of 35 nm and a peak density of $4 \times 10^{19}$ atoms/cm$^3$.

Next, substrate 200 is cleaned with a wet clean to prepare silicon surface for silicon deposition. Substrate 200 can be cleaned with a 50:1 HF dip to remove native oxides which may have formed on silicon surfaces. The HF dip can be followed by a standard rinse and dry (SRD) cycle if desired. The HF dip removes native oxides and other oxides from silicon surfaces which may impede the selective deposition of the silicon film. After a sufficient wet clean, native oxide layers may form on silicon surfaces while the surface is transferred from the wet clean station to the silicon deposition chamber.

After the substrate 200 has been sufficiently cleaned, substrate is placed in a chemical vapor deposition (CVD) reactor where a silicon or silicon alloy film will be deposited. Prior to depositing of the silicon film, substrate 200 is exposed to an insitu "flash" bake utilizing germane (GeH$_4$) to remove any contaminants and native oxides formed on silicon surfaces of substrate 200. The "flash" bake preferably utilizes an ambient comprising germane (GeH$_4$) hydrochloric acid (HCl) and hydrogen (H$_2$). No silicon source gas is provided into the chamber during the "flash" bake. During the flash bake substrate 200 is heated to a temperature between 700–900° C. with a lower temperature range of between 700–750° C. being preferred. The "flash" bake of the present invention occurs at a relatively low temperature which helps reduce the thermal budget seen by the nMOS and pMOS devices. Too high of a prebake temperature, >900° C. can increase the thermal budget seen by the devices and can cause undesired dopant redistribution of the source/drain implant and cause undesired increase in the gate overlap capacitance of the devices.

The silicon surfaces of substrate 200 can be sufficiently cleaned by heating the substrate 200 to a temperature of between 700–900° C. and generating a chamber pressure of between 10 torr–200 torr and then exposing the substrate to a gas mix comprising 1% hydrogen diluted germane (i.e., GeH$_4$ 99% H$_2$/1% GeH$_4$) at a rate of between 15–130 sccm, HCl at a flow rate of between 15–60 sccm and hydrogen at a flow rate of between 10–20 slm for between 30–180 seconds with 60 seconds being preferred. When the predeposition low energy blanket implant is arsenic (As$^{75}$) at a dose of $2 \times 10^{14}$ atoms/cm$^2$ and energy of 50 Kev, the following prebake conditions can be used: 65 sccm 1%H$_2$ diluted GeH$_4$, (i.e., 99% H$_2$/1% GeH$_4$), 36 sccm HCl, 20 slm H$_2$ at 700° C. and 20 torr for 60 seconds. When the predeposition low energy blanket implant is boron (B$^{11}$) at a dose of $2 \times 10^{14}$ atoms/cm$^2$ and an energy of 2 Kev the following prebake conditions can be used: 30 sccm 1% hydrogen diluted GeH$_4$, 45 sccm HCl and 20 slm H$_2$ at 700° C. and 20 torr for 60 seconds. Germane (GeH$_4$) is included in the prebake ambient because germanium is efficient at removing oxide from the silicon surfaces of substrate 200. When germane (GeH$_4$) enters the deposition chamber the heated substrate causes germane (GeH$_4$) to decompose and form germanium atoms which then can readily react to form germanium oxide (GeO) which is easily exhausted from the chamber. The inclusion of HCl in the "flash" bake prevents germanium deposition onto the silicon surfaces by reacting with germanium to form GeCl. The H$_2$ gas acts as a carrier gas for germane and HCl. In a preferred embodiment of the present invention the "flash" bake is an entirely thermal process relying only on heat from the substrate to cause decomposition of the germane (GeH$_4$) and to drive the cleaning reactions. In the preferred embodiment of the present invention no external energy sources such as plasma, remote plasma, or UV excitation are utilized during the "flash" bake. Additionally, the "flash" bake of the present invention preferably occurs in the same chamber (i.e., insitu) in which the subsequent silicon film is formed so that substrate 200 is not exposed to air or an oxidizing environment which can form undesired oxide on the silicon surface and impede subsequent selective silicon deposition thereon.

Figure 2I:
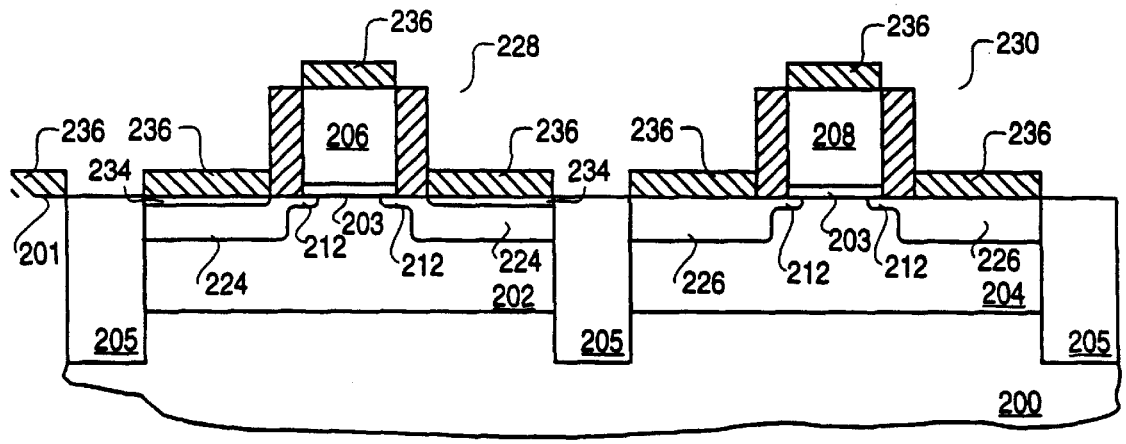
FIG. 2i is an illustration of a cross-sectional view showing the selective deposition of silicon onto the substrate of FIG. 2h.

Next, a silicon or silicon alloy film is selectively deposited onto substrate 200 as shown in FIG. 2i. Selective deposition of silicon 236 forms silicon only on silicon containing surfaces of substrate 200. For example, a selective deposition of silicon or silicon alloy on substrate 200 of FIG. 2h will deposit silicon 236 onto p-type surface regions 234 of nMOS transistor 228 and on to p-type source/drain contact regions 226 of pMOS device 230 and also onto silicon electrode 206 and 208 as shown in FIG. 2i. Silicon film 236 can be a silicon film comprising only silicon or can be a silicon alloy such a silicon germanium. A silicon film can be selectively deposited onto substrate 200 by heating substrate 200 to a temperature of 600–900° C. and providing a deposition gas comprising dichlorosilane silane (SiH$_2$ Cl$_2$) and Hydrogen (H$_2$). A silicon germanium alloy (Si$_{1-x}$ Ge$_x$) can be selectively deposited onto substrate 200 by heating substrate 200 to a temperature between 700–750° C. and providing a deposition gas mix comprising dichlorosilane (SiCl$_2$H$_2$) at a rate of between 10–300 sccm, 1% hydrogen diluted Germane (GeH$_4$) at a rate of between 10–200 sccm, and H$_2$ at a rate of about 20 slm into a CVD chamber maintained at a pressure between 10–760 torr and preferably between 50–200 torr. A dopant gas such as diborane, phosphine, and arsine can be included in the process gas mix if a doped silicon or silicon alloy film is desired. The utilization of the low energy shallow blanket implant and the insitu "flash" bake of the present invention enables the deposition of a very smooth epitaxial film at a temperature as low as 750° C. for a silicon film and 700° C. for a silicon germanium film.

A key benefit of the germane bake of the present invention is that it greatly improves the selectivity of a subsequent silicon or silicon germanium deposition after high concentration ion implantation steps. For example, during the formation of high concentration implants, such to the source/drain contact region implants and the predeposition blanket implant, high concentration of dopants are not only placed into the substrate but are also placed into the sidewall spacers 220. The dopants in the sidewall spacers act as nucleation sites for silicon or silicon germanium deposition, thereby causing silicon or silicon germanium to undesirably deposit on the spacers. The high concentration of dopants formed in the spacers during the source/drain implants or the predeposition bake implant prevents deposition condition alone from controlling and enabling the selectivity of the deposition process. It has been found, that the germane bake of the present invention supresses nucleation of silicon or silicon germanium on ion implantated spacers thereby enabling a selected deposition to occur.

Figure 2J:
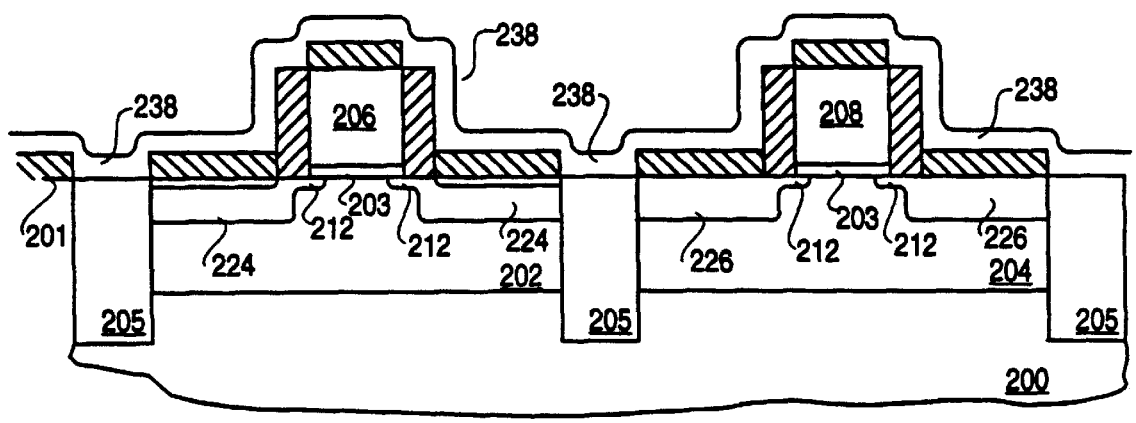
FIG. 2j is an illustration of a cross-sectional view showing the deposition of a metal layer onto the substrate of FIG. 2i.
Figure 2K:
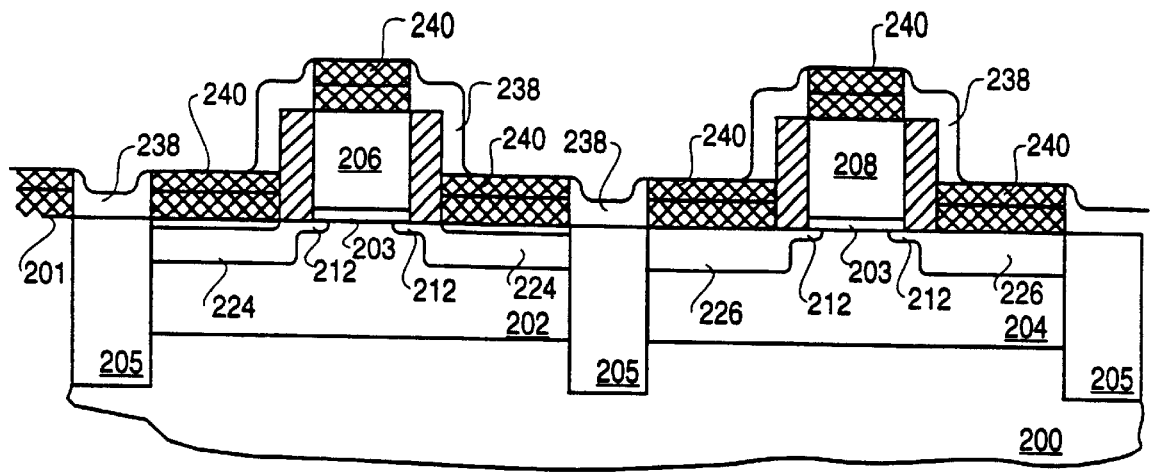
FIG. 2k is an illustration of a cross-sectional view showing the formation of a silicide on the substrate of FIG. 2j.

In an embodiment of the present invention, the deposited silicon or silicon germanium film 236 is used as a sacrificial layer for a silicide formation process. In such a silicide formation process, a metal film 238 such as but not limited to titanium (Ti), nickel (Ni), cobalt (Co), palladium (Pd) and platinum (Pt) is blanket deposited over substrate 200 as shown in FIG. 2j. Substrate 200 is then heated (annealed) at a temperature and for a period of time sufficient to cause the metal layer 238 to react with the underlying silicon film 236 to form a metal silicide 240 on source/drain regions and on gate electrodes 206 and 208 as shown in FIG. 2k. Locations, such as spacers 220 and isolation regions 205, where no silicon is available for reaction, no silicide will form. Substrate 200 can be annealed by any well known technique such as by a Rapid Thermal Process (RTP) or by a conventional furnace anneal. An RTP anneal is preferred because it reduces the thermal budget seen by the devices.

If a titanium-silicide or cobalt-silicide film is desired, then substrate 200 can be annealed, in for example, an Applied Materials Rapid Thermal Processor at a temperature between 600–900° C. in an inert ambient, such as nitrogen/argon, for approximately 20–30 seconds with five second ramp-up and ramp-down times. If a nickel-silicide, a palladium-silicide film is desired, then substrate 200 can be annealed in an AG Associates Rapid Thermal Processor at a temperature between 400–700° C. in an inert ambient for approximately 20–30 seconds with five second ramp-up and ramp-down times.

Figure 2L:
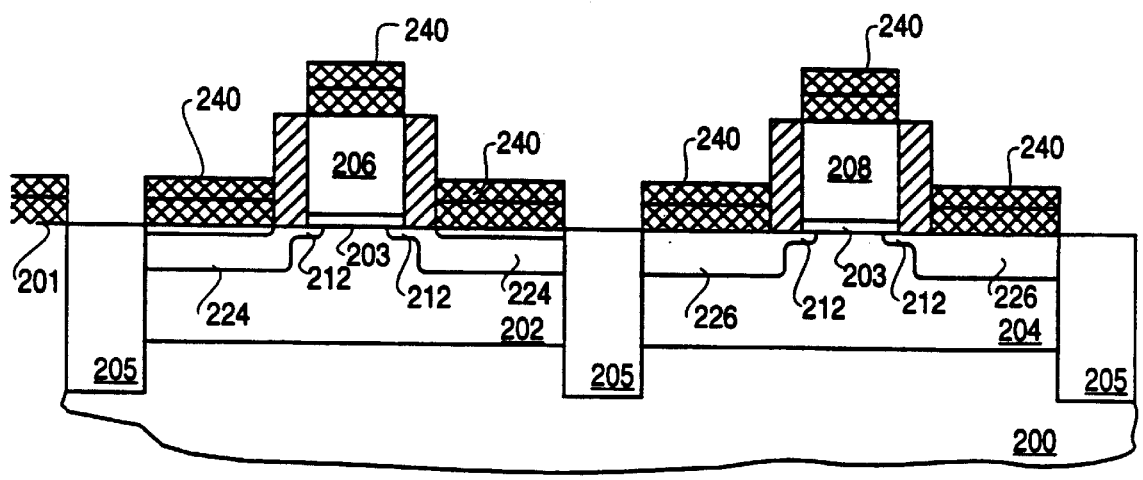
FIG. 2l is an illustration of a cross-sectional view showing the removal of unreacted portions of metal from the substrate of FIG. 2k.

Next, an etch which is selective to the metal silicide and the metal film is then used to remove the unreacted portions metal 238 from substrate 200 but yet leave the metal silicide 240 as shown in FIG. 2l. In such a process the selectively deposited silicon or silicon germanium film 236 is called a sacrificial silicon film because the entire silicon film is consumed during the silicide reaction. In such a case, the amount of sacrificial silicon and metal deposited should be chosen so that sufficient silicon and metal are available to form silicide regions 240 to a desired thickness without the need to utilize silicon from the source/drain regions and from the polysilicon electrodes 206 and 208. Utilizing a silicon sacrificial layer prevents the silicide process from consuming the source/drain junctions and from consuming the silicon gate electrodes 206 and 208. Because the silicon layer 236 is completely consumed during the silicide reaction, silicon film 236 can be an undoped silicon or silicon alloy (e.g. intrinsic silicon or intrinsic silicon germanium) without causing an undesired increase in contact resistance.

Provided below are silicon and metal film thickness which can be used to form various silicide and ensure complete consumption of the silicon film 236. If a 500 Å cobalt-silicide film is desired, then an approximately 146 Å thick cobalt layer would be deposited onto a 500 Å thick silicon layer 208. If a 500 Å thick titanium-silicide film ($TiSi_2$) is desired, then an approximately 220 Å thick titanium layer would be deposited onto an approximately 470 Å thick silicon layer 208. If a 500 Å thick nickel-silicide (NiSi) film is desired, then an approximately 250 Å thick nickel layer would be deposited onto an approximately 410 Å thick silicon layer 208. If a 500 Å thick palladium-silicide ($Pd_2Si$) film is desired, then an approximately 360 Å thick palladium layer would be deposited onto an approximately 240 Å thick silicon layer 208, and if a 500 Å thick platinum-silicide (PtSi) film is desired, then an approximately 225 Å thick platinum layer would be deposited onto a 335Å thick silicon layer 208. The above referenced silicon/metal thickness ratios can be utilized to generate thicker or thinner silicide layers as desired. Metal layer 218 is preferably formed by sputtering, however, other well known and suitable techniques such as CVD or evaporation may be used, if desired.

Figure 3A:
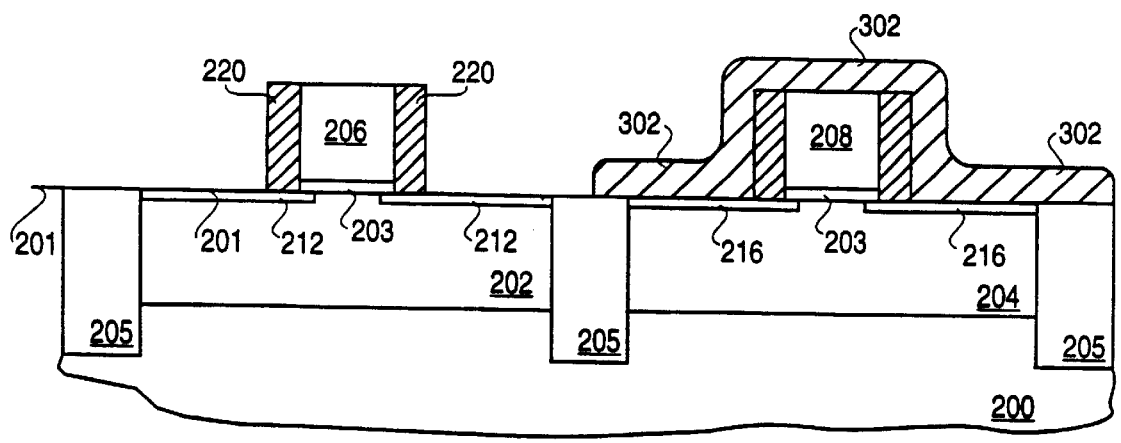
FIG. 3a is an illustration of a cross-sectional view showing the formation of a mask over the n-well of the substrate of FIG. 2e.

In another embodiment of the present invention, the novel insitu flash bake and a high deposition pressure process are used to form a highly doped ($>5 \times 10^{20}$ atoms/$cm^3$) silicon germanium epitaxial film for raised source/drain regions for MOS devices. In such an embodiment a substrate, such as substrate 200 processed as described and shown with respect FIGS. 2a–2e to form tip regions 212 and 216 and spacers 220, can be used. A mask 302 which covers n-well 204 and which leaves p-well 202 exposed is formed as shown in FIG. 3a. Mask 302 is used to cover the pMOS device 230 during a subsequent deposition of an n-type silicon germanium epitaxial film. Mask 302 is formed to a thickness and of a material which can suitably prevent silicon germanium deposition onto the n-well 204 and gate electrode 208 and which can be selectively etched with respect to spacer 220. If spacer 220 is made of silicon nitride, then masking layer 302 is preferably in an undoped oxide. An doped oxide mask 302 can be formed by blanket depositing undoped oxide to a thickness of between 100–2000 Å by chemical vapor deposition (CVD) utilizing a chemistry comprising TEOS and $O_2$ and $O_3$ at a temperature of approximately 500° C. and a pressure of approximately 100 mtorr. The CVD masking layer can then be patterned with well known photolithography and etching techniques to form mask 302 over n-well 204 as shown in FIG. 3a. An oxide film can be etched with a 1:1 HF solution or with a buffered oxide etch (BOE).

Next, the silicon surfaces of substrate 200 are cleaned with a wet etch as described above. Substrate 200 is then placed into a deposition chamber of a chemical vapor deposition (CVD) apparatus. Substrate is then exposed to the insitu flash "flash" bake of the present invention as described above.

Figure 3B:
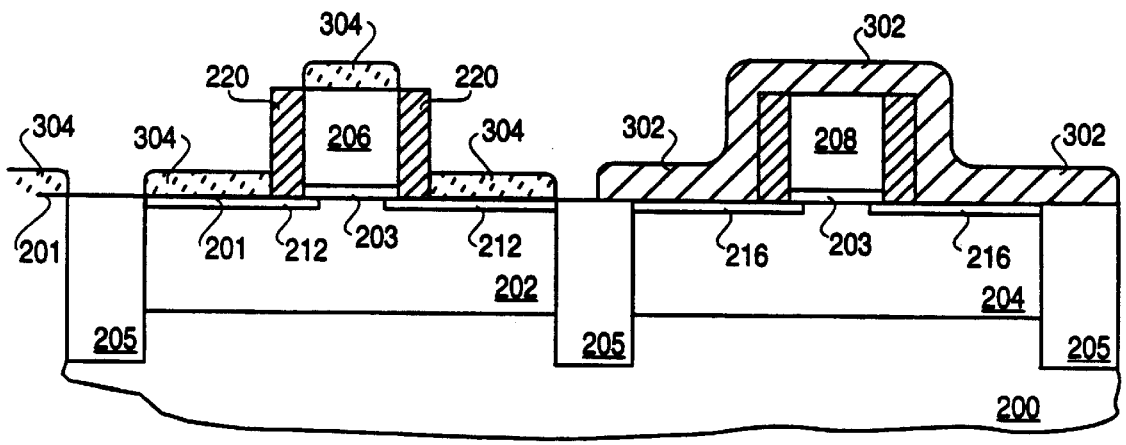

Next, as shown in FIG. 3b, and insitu doped n-type silicon or silicon germanium film 304 is selectively deposited onto substrate 200. The selective deposition process deposits n-type silicon or silicon germanium on all silicon exposed surfaces such as tip region 212 and silicon electrode 206. No silicon or silicon germanium film deposits on nonsilicon surfaces such as spacers 220, isolation region 205, and oxide mask 302. According to an embodiment of the present invention the n-type silicon film is a silicon germanium alloy comprising 10–40% germanium.

A highly doped ($>5 \times 10^{20}$ atoms/$cm^3$) n-type silicon germanium epitaxial film can be selectively deposited onto silicon surfaces by thermal chemical vapor deposition utilizing a deposition gas mix comprising germane (GeH$_4$), dichlorosiline (SiH$_2$Cl$_2$), phosphine (PH$_3$) and hydrogen while maintaining the substrate at a temperature between 700–750° C. and maintaining a relatively high deposition pressure of greater than 10 torr but less than atmospheric during film deposition and preferably a pressure between 50–200 torr. Such a process will form a uniform highly doped n-type silicon germanium epitaxial film. A 500 Å thick silicon germanium alloy doped with phosphorous to a concentration of >5×10$^{20}$ atoms/cm$^3$ can be formed by heating substrate 200 to a temperature of about 725° C. and maintaining a pressure of about 165 torr while providing a gas mix comprising 20 slm H, 15 sccm HCl, 20 sccm DCS (SiH$_2$Cl$_2$), 60 sccm 1% hydrogen diluted germane (i.e., 99% H$_2$/1% GeH$_4$) and 1–50 sccm of 1% H$_2$ diluted phosphine (i.e, 99% H$_2$/1% PH$_3$) for about 240 seconds. A 500 Å thick silicon film doped with phosphorous to a concentration of >5×10$^{20}$ atoms/cm$^3$ can be formed by heating substrate 200 to a temperature of about 750° C. and maintaining a pressure of about 760 torr while providing a gas mix comprising 10 slm H$_2$, 30 sccm HCl, 100 sccm DCS (SiH$_2$Cl$_2$), and 180 sccm of 1% H$_2$ diluted phosphine (i.e, 99% H$_2$/1% PH$_3$) for about 300 seconds. Because of the predeposition insitu flash bake and the relatively high deposition pressure employed a highly doped uniform silicon or silicon germanium film with very little faceting near the sidewall spacers can be formed.

Figure 3C:
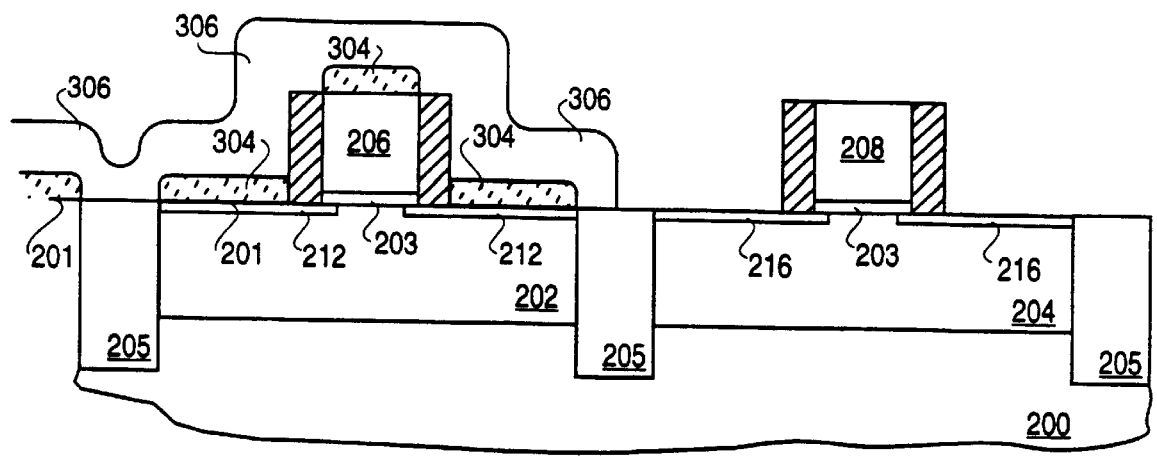
FIG. 3c is an illustration of a cross-sectional view showing the formation of a mask over the p-well.

After a sufficiently thick n-type silicon or silicon germanium film 304 has been formed, mask 302 is then removed. Mask 302 can be removed by wet etching with a 1:1 HF solution or with a BOE solution. Next, a mask 306 is formed over p-well 306 and gate electrode as shown in FIG. 3c. Mask 306 is preferably an undoped CVD oxide formed to a thickness and by a method described with respect to mask 302. Substrate 200 is now cleaned with a wet enchant and placed into a CVD deposition chamber were the substrate is exposed to the predeposition insitu flash bake of the present invention.

Figure 3D:
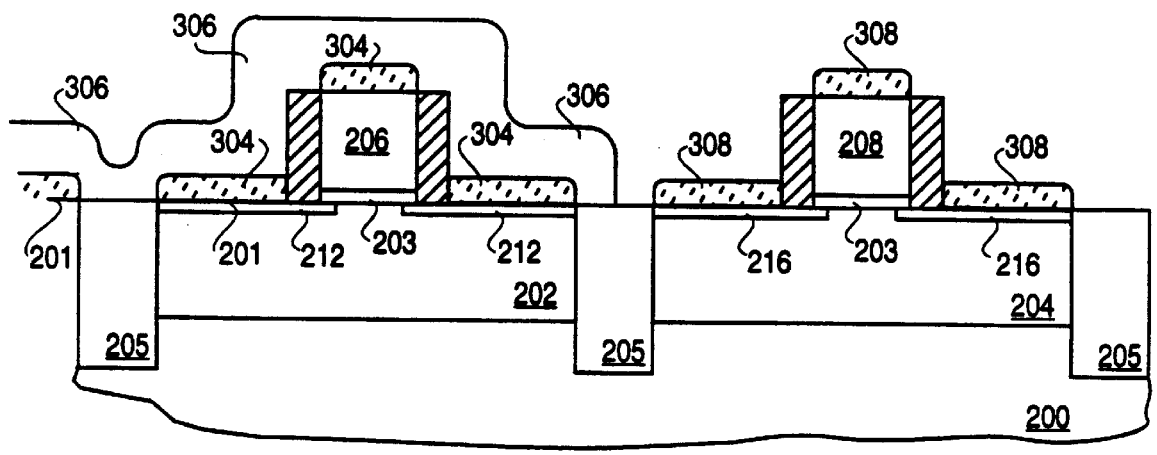
FIG. 3d is an illustration of a cross-sectional view showing the selective deposition of insitu doped p-type silicon germanium on the substrate of FIG. 3c.

Next, as shown in FIG. 3d, a p-type silicon or silicon germanium epitaxial film 308 is selectively deposited onto silicon exposed regions of substrate 200 such as source/drain regions 226 and silicon electrode 208. CVD oxide mask 306 prevents the selective deposition of p-type semiconductor material 308 onto p-well 202 and gate electrode 206. According to the preferred embodiment of the present invention silicon film 308 is a silicon germanium epitaxial film doped with p-type impurities to a concentration level of >5×10$^{20}$/cm$^3$.

According to the present invention, the silicon germanium semiconductor alloy preferably comprises approximately 10–40% germanium. A p-type silicon germanium semiconductor alloy can be formed by decomposition of approximately 20 sccms of dichlorosilane (SiH$_2$Cl$_2$), approximately 130–180 sccms of 1% hydrogen diluted germanium (GeH$_4$), and a p-type dopant source, such as approximately 5–50 sccms of 1% hydrogen diluted diborane (B$_2$H$_6$) at a temperature between 600–800° C., with 700° C. being preferred, and relatively high pressure at least 50 torrs and less than atmospheric and preferably a pressure between 50–200 torr. In order to increase the selectivity of the deposition process, approximately 10–50 sccms of HCl can be added to the gas deposition mix. A 500 Å thick silicon germanium alloy doped with boron to a concentration of 5×10$^{21}$ atoms/cm$^3$ can be formed by heating the substrate to a temperature of 740° C. and maintaining a pressure of about 165 torr while providing a gas mix comprising 20 slm H$_2$, 10 sccm HCl, 20 sccm DCS (SiH$_2$Cl$_2$) 80 sccm of 1% hydrogen dilutal germane, (i.e., 99% H$_2$/1% GeH$_4$) and 40 sccm of 1% hydrogen diluted diborane (i.e., 99% H$_2$/1% B$_2$H$_6$) for about 94 seconds. A 500 Å thick silicon film doped with boron to a concentration of 5×10$^{20}$ atoms/cm$^3$ can be formed by heating the substrate to a temperature of 800° C. and maintaining a pressure of about 20 torr while providing a gas mix comprising 20 slm H$_2$, 10 sccm HCl, 70 sccm DCS (SiH$_2$Cl$_2$) and 75 sccm of 1% hydrogen diluted diborane (i.e., 99% H$_2$/1% B$_2$H$_6$) for about 150 seconds. The relatively high deposition pressure used in the present invention enables high dopant incorporation into the film and allows a uniformly thick film to be selectively deposited. As shown in FIG. 3d the insitu prebake flash and the high pressure deposition process of the present invention enables p-type silicon or silicon germanium film 308 to be formed adjacent to spacers 220 without faceting.

After the formation of semiconductor material 322, CVD oxide mask 306 is removed by wet etching with a 1:1 HF solution or a BOE solution. It is to be appreciated that although p-type semiconductor material 304 is illustrated as being formed before p-type semiconductor material 308, it is not necessary to form p-type semiconductor material 304 first. As such, one can first mask p-well 204 and form p-type semiconductor material 308 and then mask p-well 204 and form n-type semiconductor material 304.

Figure 3E:
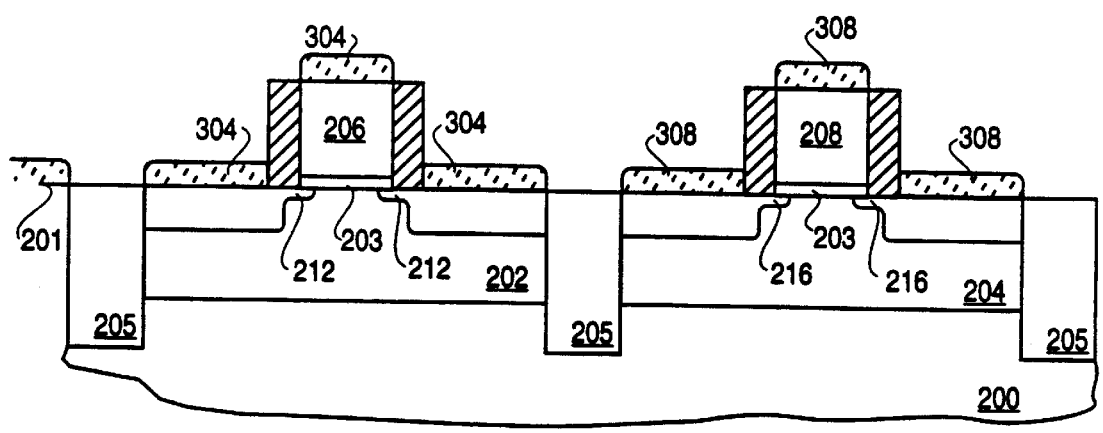
FIG. 3e is an illustration of a cross-sectional view showing the out diffusion of n-type and p-type dopants from the selective deposited silicon germanium films on the substrate of FIG. 3d.

The RTP anneal process of the present invention, as described above, can now be utilized to drive n-type impurities from semiconductor material 308 into p-well 204 to form diffusion doped semiconductor 310 as shown in FIG. 3e, to form a nMOS transistor with raised source/drain regions. Additionally, the RTP anneal process drives p-type impurities from semiconductor material 304 into n-well 302 to form diffusion doped semiconductor 312 to form a pMOS transistor with a raised source/drain regions.

If desired, a silicide layer can now be formed, as described above, onto n-type and p-type silicon germanium films 308 and 304 respectably in order to lower the contact resistance of the fabricated MOS devices.

Additionally, although the embodiment of the present invention illustrated with respect to FIGS. 3a–3e began after the formation of tip regions, one can forego the tip implants and deposit n-type and p-type semiconductor material onto p-type region 304 and onto n-type 306 and utilize an anneal to drive dopants from the deposited silicon film into the substrate laterally beneath spacers 220 and gate electrodes 206 and 208. The diffusion needs to drive dopants at least 100 Å beneath (laterally) the outside edge of gate electrode 206 and 208 and preferably to approximately 500 Å. In still yet another embodiment of the present invention the insitu flash bake and high pressure deposition process can be used to form raised source/drain regions on a substrate which has been processed through the formation of heavily doped source/drain regions 226 and 224 as illustrated in FIG. 2g or alternatively after the predeposited blanket implant described with respect to FIG. 2h. In such a case it may not be necessary to drive the dopants from the deposited silicon germanium film into the p-type region 304 and n-type region 302 or substrate 200. As is readily apparent, the insitu flash bake and high pressure silicon deposition process can be used to selectively deposit a uniform highly doped silicon or silicon germanium film on silicon surfaces in a wide variety of different manufacturing process.

Thus, novel methods or forming uniform doped and undoped silicon and silicon alloy films at low temperatures and methods for incorporation into complementary processes have been described.

We claim:

1. A method for removing an oxide comprising:
   providing a substrate having a first conductivity type region and a second conductivity type region;
   placing dopants of said first conductivity type into said second conductivity type region to form a first conductivity type surface in said second conductivity type region;
   heating said substrate;
   exposing said substrate to an ambient comprising $GeH_4$ to remove said oxide from said first conductivity type region and said first conductivity type surface in said second conductivity type region; and
   depositing a silicon or silicon alloy film onto said first conductivity type region and onto said first conductivity type surface in said second conductivity type region.

2. The method of claim 1 wherein said ambient does not include a silicon source gas.

3. The method of claim 1 wherein said substrate is heated to a temperature of less than 900° C.

4. The method of claim 3 wherein said substrate is heated to a temperature between 700° C. to 900° C.

5. The method of claim 4 wherein said substrate is heated to a temperature between 700–750° C.

6. The method of claim 1 wherein said ambient further comprises $H_2$.

7. The method of claim 1 wherein said ambient further comprises HCl.

8. The method of claim 1 wherein said ambient further comprises HCl and $H_2$.

9. The method of claim 1 further comprising the step of depositing a film comprising silicon on said substrate.

10. The method of claim 9 wherein said film further comprises up to 40 atomic percent germanium.

11. The method of claim 9 wherein said film further comprises boron.

12. A method of forming a silicon film or a silicon alloy film comprising:
    providing a substrate having a first conductivity type region and a second conductivity type region;
    placing dopants of said first conductivity type into said second conductivity type region to form a first conductivity type surface in said second conductivity type region; and
    placing said substrate in a deposition chamber;
    cleaning said first conductivity type region and said first conductivity type surface in said second conductivity type region with an ambient comprising $GeH_4$ while heating said substrate to a temperature between 700–900° C.; and
    after cleaning said silicon surface providing a deposition gas comprising a silicon source gas while generating a chamber pressure greater than 10 torr and less than atmospheric in said chamber and depositing a silicon or silicon alloy film onto said first conductivity type region and onto said first conductivity type surface in said second conductivity type region with said deposition gas.

13. The method of claim 12 wherein said deposition gas further comprises germane ($GeH_4$).

14. The method of claim 12 wherein said deposition gas further comprises a boron source gas.

15. A method of depositing a silicon germanium film on a silicon surface, said method comprising:
    providing a substrate having a first conductivity type region and a second conductivity type region;
    placing dopants of said first conductivity type into said second conductivity type region to form a first conductivity type surface in said second conductivity type region;
    cleaning said substrate with an ambient comprising $GeH_4$, $H_2$ and HCl while heating said substrate to a temperature between 700–900° C.;
    providing a deposition gas comprising $SiCl_2H_2$, $GeH_4$, HCl and $H_2$ into said chamber while maintaining a chamber pressure of greater that 10 torr and less than atmospheric; and
    depositing a silicon germanium film from said deposition gas onto said first conductivity type region and onto said first conductivity type surface in said second conductivity type region.

16. The method of claim 15 wherein said deposition gas further comprises a source of boron.

17. The method of claim 15 wherein said deposition gas further comprises a source of phosphorous.

18. The method of claim 15 further comprising the step of exposing said substrate to a 50:1 $H_2O$ to HF solution prior to cleaning said substrate with said ambient.

19. The method of claim 15 wherein said deposition pressure is between 50–200 torr.

20. The method of claim 19 wherein said deposition pressure is approximately 165 torr.

21. The method of forming a silicon or silicon alloy film on a semiconductor substrate, said method comprising:
    providing a substrate having a first conductivity type region and a second conductivity type region;
    placing dopants of said first conductivity type into said second conductivity type region to form a first conductivity type surface in said second conductivity type region;
    exposing said substrate to an ambient comprising germane ($GeH_4$); and
    depositing a silicon film onto said germane ($GeH_4$) exposed first conductivity type region and onto said germane exposed first conductivity type surface in said second conductivity type region.

22. The method of claim 21 wherein said ambient further comprises $H_2$ and HCl.

23. The method of claim 21 further comprising the step of exposing said substrate to a solution comprising $H_2O$ and HF prior to exposing said substrate to said ambient.

24. A method of depositing a silicon or silicon alloy film comprising the steps of:
    providing the substrate having a first conductivity type region and a second conductivity type region;
    placing dopants of said first conductivity type into said second conductivity type region to form a first conductivity type surface in said second conductivity type region; and
    depositing a silicon or silicon alloy film onto said first conductivity type region and onto said first conductivity type surface in said second conductivity type region.

25. A method of forming a CMOS integrated circuit, said method comprising the steps of:
    forming a first gate electrode on a first gate dielectric formed on a first conductivity type region of a substrate, and forming a second gate electrode on a second dielectric layer formed on a second conductivity region of said substrate;
    forming a first pair of source/drain regions of a second conductivity type in said first conductivity type region on opposite sides of said first gate electrode and forming a second pair of source/drain regions of a first conductivity type in said second conductivity type region on opposite sides of said second gate electrode;

placing dopants of said first conductivity type into said first pair of source/drain regions of said second conductivity type on opposite sides of said first gate electrode to form a pair of first conductivity type regions in said first pair of source/drain regions on opposite sides of said first gate electrode; and depositing a film comprising silicon onto said pair of first conductivity type regions in said first, pair of source/drain regions and onto said second pair of source/drain regions of said first conductivity type on opposite sides of said second gate electrode.

26. The method of claim 24 wherein said dopants of said first conductivity type are placed into said first pair of source/drain regions of said second conductivity type by a low energy ion implantation.

27. The method of claim 26 wherein said first conductivity type dopant used to form said pair of first conductivity type regions in said first pair of source/drain regions is arsenic and the implant energy is 50 keV.

28. The method of claim 26 wherein said first conductivity dopant used to form said pair of first conductivity type regions in said first pair of source/drain regions is boron and the implant energy is 2 keV.

29. The method of claim 26 further comprising the step of:

exposing said pair of second conductivity type regions in said first said conductivity type region and said second conductivity type region to an ambient comprising germane ($GeH_4$) prior to depositing said silicon germanium film.

30. A method of forming a transistor, said method comprising:

forming a gate electrode on a gate dielectric layer formed on a substrate;

forming a pair of sidewall spacers on laterally opposite sides of said gate electrode;

implanting ions into said substrate adjacent to the outside edges of said spacers and into said spacers;

heating said substrate and exposing said substrate and said doped spacers to an ambient comprising germane ($GeH_4$); and selectively depositing a silicon or silicon alloy film onto said ion implantated substrate and not onto said pair of sidewall spacers.

* * * * *

UNITED STATES PATENT AND TRADEMARK OFFICE
CERTIFICATE OF CORRECTION

PATENT NO.    : 6,235,568 B1
DATED         : May 22, 2001
INVENTOR(S)   : Anand Murthy et al.

It is certified that error appears in the above-identified patent and that said Letters Patent is hereby corrected as shown below:

<u>Column 3,</u>
Line 38, delete "> atmospheric" and insert -- $\leq$ atmospheric --.

Signed and Sealed this

Twenty-seventh Day of August, 2002

Attest:

Attesting Officer

JAMES E. ROGAN
*Director of the United States Patent and Trademark Office*